(12) United States Patent
Kim et al.

(10) Patent No.: US 8,599,893 B2
(45) Date of Patent: Dec. 3, 2013

(54) TERAHERTZ WAVE GENERATOR

(75) Inventors: Namje Kim, Daejeon (KR); Kyung Hyun Park, Daejeon (KR); Young Ahn Leem, Daejeon (KR); Hyunsung Ko, Seoul (KR); Sang-Pil Han, Daejeon (KR); Chul-Wook Lee, Daejeon (KR); Dong-Hun Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 127 days.

(21) Appl. No.: 13/225,609

(22) Filed: Sep. 6, 2011

(65) Prior Publication Data

US 2012/0147907 A1 Jun. 14, 2012

(30) Foreign Application Priority Data

Dec. 13, 2010 (KR) ........................ 10-2010-0127117

(51) Int. Cl.
*H01S 5/00* (2006.01)
(52) U.S. Cl.
USPC .............. 372/43.01; 372/4; 372/32; 372/50.1

(58) Field of Classification Search
USPC ......................................... 372/4, 43.01, 50.1
See application file for complete search history.

(56) References Cited

U.S. PATENT DOCUMENTS

| 7,174,070 | B2 | 2/2007 | Kim et al. | |
|---|---|---|---|---|
| 2010/0092183 | A1 | 4/2010 | Kim et al. | |
| 2011/0149368 | A1* | 6/2011 | Kim et al. | 359/276 |
| 2012/0051386 | A1* | 3/2012 | Kim et al. | 372/96 |

FOREIGN PATENT DOCUMENTS

| KR | 10-2005-0059638 A | 6/2005 |
|---|---|---|
| KR | 10-0951850 B1 | 4/2010 |

* cited by examiner

*Primary Examiner* — Dung Nguyen
(74) *Attorney, Agent, or Firm* — Rabin & Berdo, P.C.

(57) ABSTRACT

Disclosed is a terahertz wave generator which includes a dual mode semiconductor laser device configured to generate at least two laser lights having different wavelengths and to beat the generated laser lights; and a photo mixer formed on the same chip as the dual mode semiconductor laser device and to generate a continuous terahertz wave when excited by the beat laser light.

10 Claims, 4 Drawing Sheets

TERAHERTZ WAVE GENERATOR

CROSS-REFERENCE TO RELATED APPLICATIONS

This application claims the benefits, under 35 U.S.C §119, of Korean Patent Application No. 10-2010-0127117 filed Dec. 13, 2010, the entirety of which is incorporated by reference herein.

BACKGROUND

Exemplary embodiments relate to a semiconductor device, and more particularly, relate to a terahertz wave generator.

A terahertz (THz) wave may be an electromagnetic wave between a microwave and an infra ray, and may have a frequency within a range of 0.1 THz to 30 THz. The terahertz wave may have both wave-like characteristics (e.g., the dielectric penetrability of a radio wave) and the particle-like characteristics (e.g., the propagation direction of a light wave). The terahertz wave with absorption is applicable to image, spectrum, and communication fields as a new technology. It is possible to penetrate the interior of a substance or to analyze a body mechanism of a molecule motion energy level and a space signal, using the terahertz wave. Further, an ultrahigh-speed short-range wireless communication can be made more excellently using the terahertz wave as compared with a microwave and a millimeter wave.

The THz wave technology with the above-described applicability may have been limited due to a trouble of development of a light source and a detector. However, development of semiconductor and laser technologies may enable the appearance of various light sources. Hitherto developed pulse light source technologies may include a photoconductive antenna manner, an optical rectification manner, and the like. Continuous wave light sources for generating a THz wave may include a photo mixer, a hot-hole laser, a free electron laser, a quantum cascade laser, and the like.

The photo mixer may be considered as a terahertz technology with a relatively high commercialization probability as compared with other technologies. The reason may be because the photo mixer is driven at a room temperature, freely varies a frequency, and is implemented by a low-cost, small-sized system.

The photo mixer may generate or detect a THz wave using a photoconductive material whose carrier lifetime is within a range of hundreds femtoseconds (fs) to several pico-seconds (ps) and an antenna formed on the photoconductive material. The photoconductive material may be a material whose resistance varies by a carrier excited by an exciting light. The photoconductive material may play a role of a switch which enables a current to flow to an integrated antenna. The antenna and a photoconductive switch may constitute a photo mixer.

A femtosecond pulse laser may be mainly used to generate a terahertz wave. Since the intensity of light is large, the femtosecond pulse laser may generate a pulse terahertz wave having a relatively large intensity at a wide frequency region. In case of generating a continuous terahertz wave, two laser beams of different wavelengths may be beat and a resultant may be used as an excited wave. Upon generating of a continuous THz wave with a variable frequency, two continuous waves output from two distributed feedback lasers (DFBs) or a continuous light source laser may be used. If one or all (two) wavelengths are varied, a frequency of a beat signal may be varied, so that a frequency of a produced THz wave is changed. The intensity of the exciting light may be maintained largely while a wavelength is changed.

In recent, needs for portable terahertz generator/detector may increase. However, a bulky femtosecond laser generator may be used as a light source of an exciting light used at a terahertz generator/detector. Accordingly, there may be required a technology of implementing terahertz generator and detector with a low cost and a small size.

SUMMARY

One aspect of embodiments of the inventive concept is directed to provide a terahertz wave generator which comprises a dual mode semiconductor laser device configured to generate at least two laser lights having different wavelengths and to beat the generated laser lights; and a photo mixer formed on the same chip as the dual mode semiconductor laser device and to generate a continuous terahertz wave when excited by the beat laser light.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
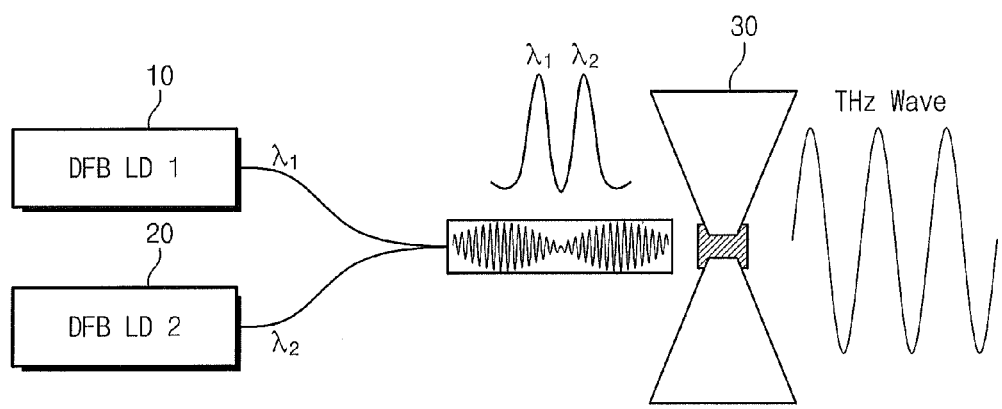
FIG. 1 is a diagram schematically illustrating a terahertz wave generator.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a diagram schematically illustrating a terahertz wave generator. Referring to FIG. 1, a terahertz wave generator may generate a continuous terahertz wave and may include the first and second distributed feedback laser light sources 10 and 20 and a photo mixer 30.

The first and second distributed feedback layer light sources 10 and 20 may generate laser lights having different wavelengths λ1 and λ2. A light obtained by beating the laser lights may be used as an exciting light of the photo mixer 30. A frequency of the exciting light may correspond to a wavelength difference of the two laser lights. At this time, the intensity of the exciting light may be maintained largely while a wavelength is changed.

At least one laser light source must be configured to tune a continuous wavelength and may necessitate a rotatable and movable stage finely operated below a micrometer and bulky optical parts such as a beam splitter, a mirror, and the like. For this reason, the at least one laser light source may occupy a space, thus becoming a high-priced equipment.

The photo mixer 30 may be made by forming a photoconductive material on a substrate using a thin film, forming a photo diode designed to have a fast response speed, and forming an antenna on a resultant structure to be opposite to each other.

The first and second distributed feedback laser light sources 10 and 20 may be formed of a dual mode semiconductor laser device. According to an exemplary embodiment of the inventive concept, there may be provided a dual mode semiconductor laser device which is configured to emit two laser lights having different wavelengths and to make continuous tuning. The dual mode semiconductor laser device according to an exemplary embodiment of the inventive concept may be provided as a semiconductor laser device which can be formed on the same chip as the photo mixer 30.

Figure 2:
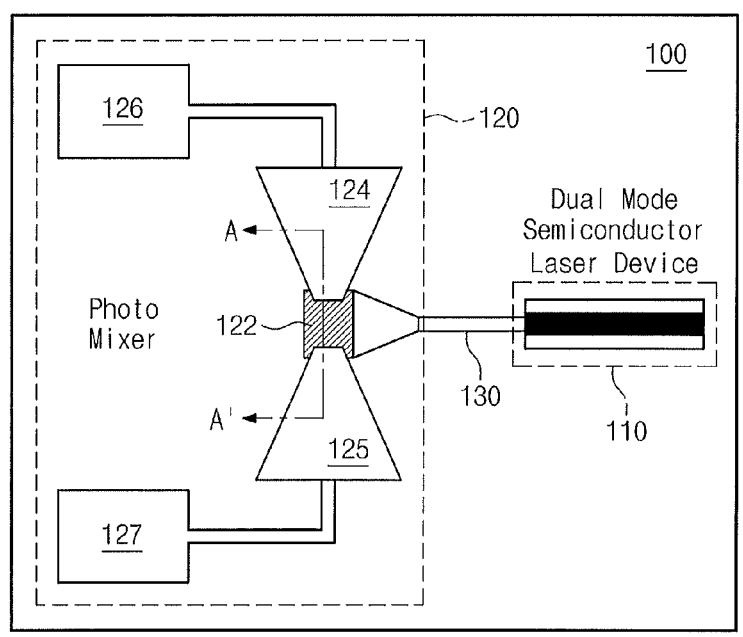
FIG. 2 is a diagram illustrating a terahertz wave generator according to an exemplary embodiment of the inventive concept.

FIG. 2 is a diagram illustrating a terahertz wave generator according to an exemplary embodiment of the inventive concept. Referring to FIG. 2, a terahertz wave generator 100 may include a dual mode semiconductor laser device 110 and a photo mixer 120.

The dual mode semiconductor laser device 110 may provide the photo mixer 120 with a mixed light of two different wavelengths. The dual mode semiconductor laser device 110 may generate two continuous wave laser lights having different wavelengths. The generated laser lights may be beat, and the beat result may be provided to the photo mixer 120. A photo-mixing manner for obtaining a terahertz wave having a frequency corresponding to a beating period may be implemented with a relatively low cost and may be driven at a room temperature. At least one laser light may be tunable with respect to a continuous wave.

In particular, the dual mode semiconductor laser device 110 may be a device which can be integrated in a single chip with the photo mixer 120. A wavelength band of 800 nm has been researched due to a physical property of a low-temperature growth gallium arsenide (GaAs). Accordingly, when formed by a device driven at the wavelength band of 800 nm, the dual mode semiconductor laser device 110 may have such an advantage that a tuning region is small. On the other hand, a wavelength difference between two laser lights may be about 2 nm to obtain a beating signal having a frequency of 1 THz at a band of 1500 nm. A wavelength difference between two laser lights may be reduced to about 2 nm in cased of a band of 800 nm. If a frequency-variable dual mode semiconductor laser device 110 driven at the band of 800 nm is fabricated, a frequency-variable region of a continuous THz wave may be widened although a tuning region is relatively small.

In general, technologies and materials needed to make a semiconductor laser at a band of 1500 nm was well developed together with development of an optical communication system. On the other hand, development on technologies and materials needed to make a semiconductor laser at a band of 800 nm may be limited due to insufficient research on the band of 800 nm. When a dual mode semiconductor laser device 110 of the band of 800 nm is fabricated, it is difficult to make a regrowing process due to a material such as aluminum. The low-temperature growth GaAs or the photo mixer may be sensitive to heating after growth. Accordingly, if a high-temperature process for other devices is accompanied, characteristics of such devices may be lowered.

A low-temperature growth manner using MBE (molecular beam epitaxy) cannot use regrowth-possible MOCVD (metal organic chemical vapor deposition). For this reason, there may be generated such a problem that it is impossible to regrow a low-temperature growth photo mixer 120 after firstly making a semiconductor laser device. In the event that a photo-conductive antenna (PCA) of the photo mixer 120 uses a photo diode having a fast response speed, it is advantageous to minimize a regrowth process in order to prevent characteristics of two integrated devices from being lowered. Accordingly, a simple structure of a dual mode semiconductor laser device 110 being integrated may be required.

The photo mixer 120 may be made by forming a photoconductive material on a substrate using a thin film, forming a photo diode designed to have a fast response speed, and forming antennas 124 and 125 on a resultant structure to be opposite to each other. Electrodes 126 and 127 may be further provided to bias the antennas 124 and 125. The photo mixer 120 in FIG. 2 may be exemplary. Various shapes of antennas may be used for the photo mixer 120 according to an exemplary embodiment of the inventive concept. The photo mixer 120 will be more fully described with reference to FIG. 5, below.

In general, the photo mixer 120 may be grown at a low temperature (about 200° C. to 250° C.) using the MBE (molecular beam epitaxy) or may be formed of an ion-injected semiconductor. Accordingly, it is difficult to integrate the photo mixer 120 with a semiconductor laser. In the event that a low-temperature growth or ion-injected semiconductor is used as a photoconductive antenna (PCA), heating after growth or ion injection may be very important. Accordingly, a regrowth process accompanied at a semiconductor laser process has no remedy but to be limited.

Development of a single-chip terahertz wave generator may be advantageous when a semiconductor laser device process does not include a regrowth process. Further, in the event that a photo diode with a fast response speed is used, it is advantageous to minimize a regrowth process in order to stably maintain properties of the dual mode semiconductor laser device 110 and the photo mixer 120.

The dual mode semiconductor laser device 110 according to an exemplary embodiment of the inventive concept may be integrated on a single chip with the photo mixer 120. The integrated dual mode semiconductor laser device 110 may be implemented by a ridge-type semiconductor to minimize a regrowth process. A metal grating or a ridge shape may be adjusted to form a distributed feedback laser. An exciting light output from the dual mode semiconductor laser device 110 may be provided to a photoconductive antenna (PCA) of the photo mixer 120. This may accomplished by using a wave guide 130 from an output of a laser to the photo mixer 120. The wave guide 130 may be implemented by an active wave guide not necessitating regrowth.

A current of a terahertz band may flow to an integrated antenna due to an exciting light incident upon the photo mixer 120. As a result, the photo mixer 120 may emit a continuous wave of a terahertz band. The photo mixer 120 may be formed of a wave guide type so as to be formed by an integrated device.

Figure 3:
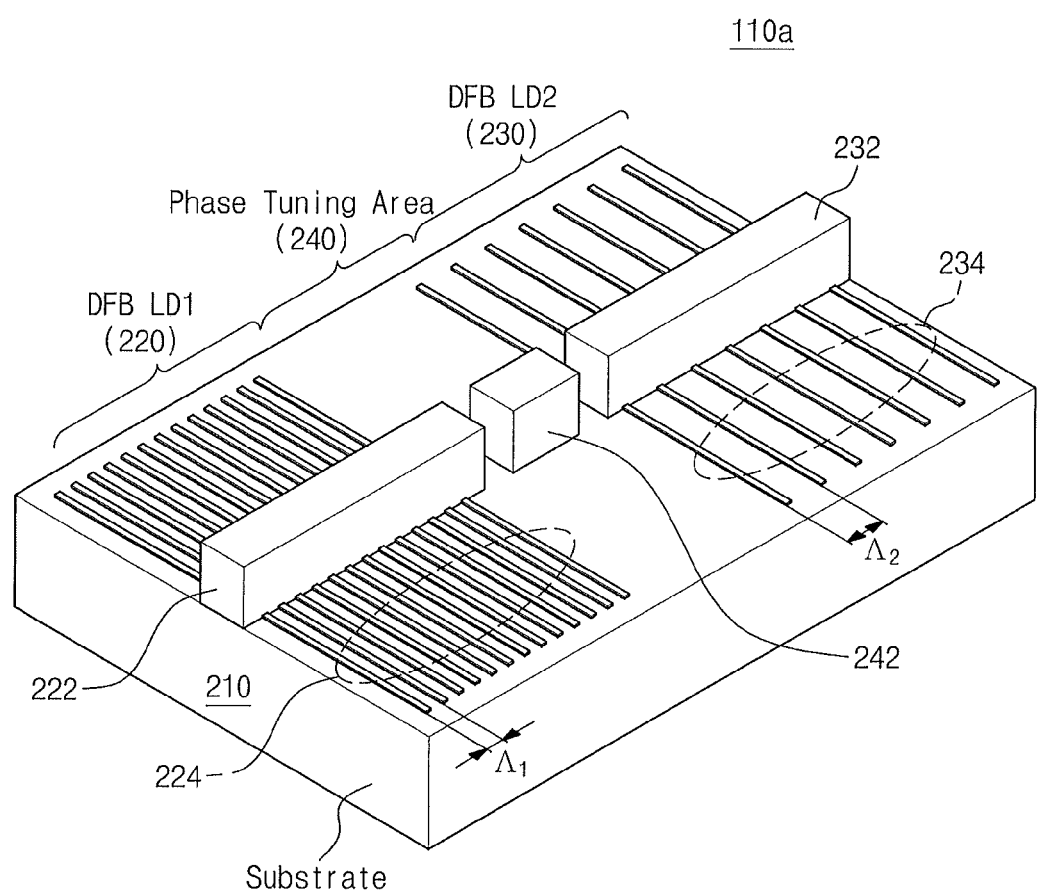
FIG. 3 is a diagram illustrating a dual mode semiconductor laser device in FIG. 2 according to an exemplary embodiment of the inventive concept.

FIG. 3 is a diagram illustrating a dual mode semiconductor laser device in FIG. 2 according to an exemplary embodiment of the inventive concept. Referring to FIG. 3, a dual mode semiconductor laser 110a may be formed using a ridge-type semiconductor laser to minimize a regrowth process. The dual mode semiconductor laser 110a may include the first and second distributed feedback lasers 220 and 230 and a phase tuning region 240.

The first distributed feedback laser 220 may include the first wave guide layer 222 formed on a substrate 210. The first wave guide layer 222 may be formed of an active wave guide. A passive wave guide may need a regrowth process. Accordingly, it is difficult to make a photo mixer 120 in FIG. 2 on a single chip. To constitute the first distributed feedback laser 220, the first diffraction grating 224 may be formed at a side of the first wave guide layer 222.

The second distributed feedback laser 230 may include the second wave guide layer 232 formed on the substrate 210. The second wave guide layer 232 may be formed of an active wave guide not needing a regrowth process like the first wave guide layer 222. To constitute the second distributed feedback laser 230, the second diffraction grating 234 may be formed at a side of the second wave guide layer 232.

The phase tuning region 240 may be formed between the first distributed feedback laser 220 and the second distributed feedback laser 230. The phase tuning region 240 may include the third wave guide layer 242 formed on the substrate 210. The third wave guide layer 242 may be configured by the same active wave guide as the first and second wave guide layers 222 and 232. The phase tuning region 240 may shift phases of lights generated by the first and second distributed feedback lasers 220 and 230 according to a variation of a reflective index.

Herein, the first to third wave guide layers 222, 232, and 242 may be formed using the same process. The first to third wave guide layers 222, 232, and 242 may include the same gain material, respectively. The first to third wave guide layers 222, 232, and 242 may be formed to have a reflective index larger than that of the substrate 210 or a clad layer (not shown).

The first and second diffraction gratings 224 and 234 may be formed at sides of the first and second wave guide layers 222 and 232 using metal grating. The first and second diffraction gratings 224 and 234 may be formed between the substrate 210 and a clad layer (not shown), having different reflective indexes, to have a distributed Bragg reflector (DBR) shape.

Grating periods A1 and A2 of the first and second diffraction gratings 224 and 234 may be depended on a wavelength of a generated laser light. The grating periods A1 and A2 of the first and second diffraction gratings 224 and 234 may be different or identical. The first and second diffraction gratings 224 and 234 may be formed such that an interval between gratings increases or decreases gradually. The first and second diffraction gratings 224 and 234 can be formed by an index grating formed via a change of a ridge structure of the first and second wave guide layers 222 and 232. Locations of the first and second diffraction gratings 224 and 234 are not limited thereto.

In an exemplary embodiment, the substrate 210 may be formed of n-InP or n-GaAs. Further, the substrate 210 can be formed using n-type compound semiconductor or p-type compound semiconductor.

Figure 4:
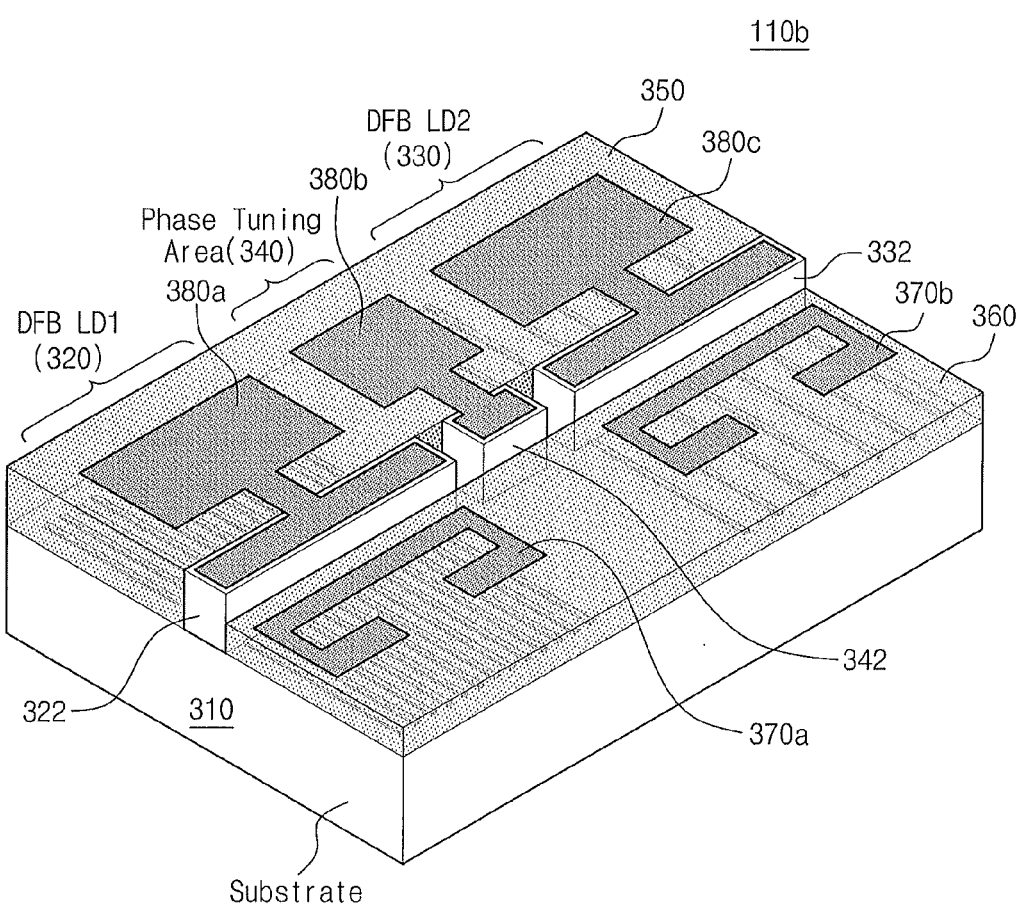
FIG. 4 is a detailed diagram illustrating a dual mode semiconductor laser device in FIG. 2.

FIG. 4 is a detailed diagram illustrating a dual mode semiconductor laser device in FIG. 2. Referring to FIG. 4, a dual mode semiconductor laser device 110b may be formed of a ridge type not needing a regrowth process. The dual mode semiconductor laser device 110b may include the first and second distributed feedback lasers 320 and 330 and a phase tuning region 340.

The first distributed feedback laser 320 may include the first wave guide layer 322 formed on a substrate 310. The first wave guide layer 322 may be formed of an active wave guide. A passive wave guide may need a regrowth process. Accordingly, it is difficult to make a photo mixer 120 in FIG. 2 on a single chip. To constitute the first distributed feedback laser 320, the first diffraction grating 324 may be formed at a side of the first wave guide layer 322.

The second distributed feedback laser 330 may include the second wave guide layer 332 formed on the substrate 310. The second wave guide layer 332 may be formed of an active wave guide not needing a regrowth process like the first wave guide layer 322. To constitute the second distributed feedback laser 330, the second diffraction grating 334 may be formed at a side of the second wave guide layer 332.

The phase tuning region 340 may be formed between the first distributed feedback laser 320 and the second distributed feedback laser 330. The phase tuning region 340 may include the third wave guide layer 342 formed on the substrate 310. The third wave guide layer 342 may be configured by the same active wave guide as the first and second wave guide layers 322 and 332. The phase tuning region 340 may shift phases of lights generated by the first and second distributed feedback lasers 320 and 330 according to a variation of a reflective index.

Herein, the first to third wave guide layers 322, 332, and 342 may be formed using the same process. The first to third wave guide layers 322, 332, and 342 may include the same gain material, respectively. The first to third wave guide layers 322, 332, and 342 may be formed to have a reflective index larger than that of the substrate 310 or a clad layer (not shown).

The first and second diffraction gratings 324 and 334 may be formed at sides of the first and second wave guide layers 322 and 332 using metal grating. The first and second diffraction gratings 324 and 334 may be formed between the substrate 310 and a clad layer (not shown), having different reflective indexes, to have a distributed Bragg reflector (DBR) shape. Grating periods A1 and A2 of the first and second diffraction gratings 324 and 334 may be depended on a wavelength of a generated laser light. The grating periods A1 and A2 of the first and second diffraction gratings 324 and 334 may be different or identical. The first and second diffraction gratings 324 and 334 may be formed such that an interval between gratings increases or decreases gradually. The first and second diffraction gratings 324 and 334 can be formed by an index grating formed via a change of a ridge structure of the first and second wave guide layers 322 and 332. Locations of the first and second diffraction gratings 324 and 334 are not limited thereto.

In particular, the first and second micro heaters 370a and 370b may be further provided on upper portions of the first and second diffraction gratings 324 and 334. Reflective indexes of the first and second wave guide layers 322 and 332 may be changed by the Joule's heat produced by the first and second micro heaters 370a and 370b. Further, the reflexibility of the first and second micro heaters 370a and 370b may be continuously controlled by the Joule's heat produced by the first and second micro heaters 370a and 370b. The first and second micro heaters 370a and 370b may be formed of a metal layer deposited on an upper portion of an insulation layer 360.

Electrodes 380a, 380b, and 380c may be formed on upper portions of the first to third wave guide layers 322, 332, and 342. It is possible to control the reflexibility of the first and second wave guide layers 322 and 332 via the electrodes 380a and 380c. Further, it is possible to control the reflexibility of the third wave guide layer 342 via the electrode 380b. A phase of a beat exciting light can be shifted by controlling the reflexibility of the third wave guide layer 342 via the electrode 380b.

Figure 5:
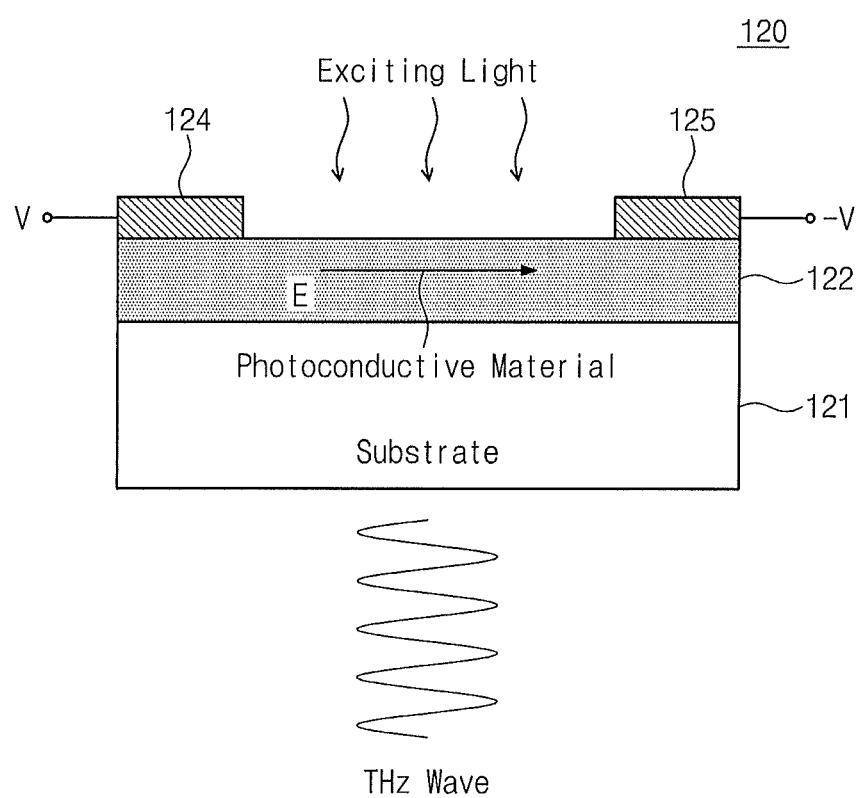
FIG. 5 is a cross sectional view illustrating a photo mixer taken along a line A-A' in FIG. 2.

FIG. 5 is a cross sectional view illustrating a photo mixer taken along a line A-A' in FIG. 2. Referring to FIG. 5, a photo mixer 120 may be formed by forming a photoconductive material 122 or a photo diode having a fast response speed and forming antennas 124 and 125 on a resultant structure so as to be opposite to each other.

An exciting light may be a beating signal amplified or modulated by a semiconductor optical amplifier 110. An electric field E may be formed at a photoconductive material 122 by bias voltages V and −V applied to the antennas 124 and 125, respectively. If an exciting light is input under the bias condition, a carrier (an electron-hole pair) may be generated at the photoconductive material 122 by light absorption. Since accelerated by the electric field E formed at the photoconductive material 122, the carrier may be shifted into an antenna instantly. A terahertz wave may be generated from the antenna by light current flowing during a carrier lifetime (about hundreds femtoseconds).

According to an exemplary embodiment of the inventive concept, it is possible to provide a terahertz wave generator which can be integrated on a single chip and does not necessitate a regrowth process. Further, it is possible to provide portable, small-sized, and reliable terahertz wave generator and detector.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A terahertz wave generator comprising:
    a dual mode semiconductor laser device configured to generate at least two laser lights having different wavelengths and to beat the generated laser lights;
    a photo mixer formed on a same chip as the dual mode semiconductor laser device and to generate a continuous terahertz wave when excited by the beat laser light;
    a first distributed feedback laser diode configured to generate a light having a first wavelength;
    a second distributed feedback laser diode configured to generate a light having a second wavelength; and
    a phase tuning region placed between the first distributed feedback laser diode and the second distributed feedback laser diode and configured to control a phase of one of the first and second wavelengths.

2. The terahertz wave generator of claim 1, wherein the dual mode semiconductor laser device is formed by a ridge type.

3. The terahertz wave generator of claim 1, wherein each of the first distributed feedback laser diode, the second distributed feedback laser diode, and the phase tuning region includes an active wave guide.

4. The terahertz wave generator of claim 3, further comprising:
    electrodes formed on upper portions of the active wave guides to control a reflexibility of the active wave guides.

5. The terahertz wave generator of claim 1, wherein the first distributed feedback laser diode includes a first diffraction grating having a first grating period, and the second distributed feedback laser diode a second diffraction grating having a second grating period.

6. The terahertz wave generator of claim 5, wherein the first and second diffraction gratings are formed by a metal grating at a side of the active wave guide.

7. The terahertz wave generator of claim 5, further comprising:
    first and second micro heaters provided on upper portions of the first and second diffraction gratings and configured to control the first wavelength and the second wavelength.

8. The terahertz wave generator of claim 1, wherein the photo mixer is formed of a wave guide type photo mixer.

9. The terahertz wave generator of claim 1, further comprising:
    a wave guide configured to transfer the beat laser light from the dual mode semiconductor laser device to the photo mixer.

10. The terahertz wave generator of claim 9, wherein the wave guide is formed of an active wave guide not needing a regrowth process.

* * * * *